United States Patent
Shirota (12)

(10) Patent No.: US 11,778,819 B2
(45) Date of Patent: Oct. 3, 2023

(54) NAND FLASH MEMORY WITH REDUCED PLANAR SIZE

(71) Applicant: Winbond Electronics Corp., Taichung (TW)

(72) Inventor: Riichiro Shirota, Kanagawa (JP)

(73) Assignee: Winbond Electronics Corp., Taichung (TW)

(\*) Notice: Subject to any disclaimer, the term of this patent is extended or adjusted under 35 U.S.C. 154(b) by 86 days.

(21) Appl. No.: 16/935,199

(22) Filed: Jul. 22, 2020

(65) Prior Publication Data

US 2022/0028880 A1 Jan. 27, 2022

(51) Int. Cl.
*H10B 43/27* (2023.01)
*H10B 43/10* (2023.01)
(Continued)

(52) U.S. Cl.
CPC .............. *H10B 43/27* (2023.02); *G11C 7/18* (2013.01); *H01L 29/66833* (2013.01);
(Continued)

(58) Field of Classification Search
CPC ...... H01L 27/115–11597; H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23;
(Continued)

(56) References Cited

U.S. PATENT DOCUMENTS 9,520,485 B2 \* 12/2016 Lue .................. H01L 29/66833
9,911,754 B1 \* 3/2018 Guo ..................... H01L 29/513
(Continued)

FOREIGN PATENT DOCUMENTS

| CN | 102637692 | 8/2012 |
|---|---|---|
| JP | 2011165972 | 8/2011 |

(Continued)

OTHER PUBLICATIONS

"Office Action of Korea Counterpart Application", dated Aug. 31, 2021, p. 1-p. 7.
(Continued)

*Primary Examiner* — Didarul A Mazumder
*Assistant Examiner* — Gustavo G Ramallo
(74) *Attorney, Agent, or Firm* — JCIPRNET

(57) ABSTRACT

A NAND flash memory capable of reducing the planar size of a memory cell is provided. The three-dimensional NAND flash memory includes a substrate, an insulating layer, a lower conductive layer (a source), a three-dimensional memory cell structure, and a bit line. The memory cell structure includes a plurality of strip-shaped gate stacks including stacks of insulators and conductors stacked along a vertical direction from the substrate; and a plurality of channel stacks separately arranged along one side of the gate stack. An upper end of the channel stack is electrically connected to the orthogonal bit line, and a lower end of the channel stack is electrically connected to the lower conductive layer.

15 Claims, 24 Drawing Sheets

Cross-sectional view along line A-A

(51) Int. Cl.
*H01L 29/792* (2006.01)
*G11C 7/18* (2006.01)
*H01L 29/66* (2006.01)
*H10B 43/35* (2023.01)

(52) U.S. Cl.
CPC ......... *H01L 29/7926* (2013.01); *H10B 43/10* (2023.02); *H10B 43/35* (2023.02)

(58) Field of Classification Search
CPC ........ H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 2008/0121981 | A1* | 5/2008 | Shiraiwa | H10B 69/00 257/E21.21 |
| 2008/0179659 | A1* | 7/2008 | Enda | H01L 27/11582 257/326 |
| 2008/0259687 | A1* | 10/2008 | Specht | H10B 69/00 257/E21.679 |
| 2010/0159657 | A1 | 6/2010 | Arai et al. | |
| 2011/0018051 | A1* | 1/2011 | Kim | H01L 29/7926 257/314 |
| 2012/0068255 | A1* | 3/2012 | Lee | H01L 27/11582 257/324 |
| 2015/0340369 | A1 | 11/2015 | Lue | |
| 2016/0240551 | A1* | 8/2016 | Lai | H01L 27/11582 |
| 2016/0284808 | A1* | 9/2016 | Yang | H01L 29/42372 |

FOREIGN PATENT DOCUMENTS

| | | |
|---|---|---|
| JP | 2015038994 | 2/2015 |
| JP | 2015176870 | 10/2015 |
| KR | 20120029194 | 3/2012 |
| TW | 201624529 | 7/2016 |
| TW | 201712912 | 4/2017 |
| TW | 201715705 | 5/2017 |
| TW | 201721921 | 6/2017 |
| TW | 201740508 | 11/2017 |

OTHER PUBLICATIONS

Hang-Ting Lue et al., "A Novel Double-density, Single-Gate Vertical Channel (SGVC) 3D NAND Flash That Is Tolerant to Deep Vertical Etching CD Variation and Possesses Robust Read-disturb Immunity", 2015 IEEE International Electron Devices Meeting (IEDM), Dec. 7-9, 2015, pp. 3.2.1-3.2.4.

"Office Action of Taiwan Counterpart Application", dated Apr. 7, 2021, p. 1-p. 7.

* cited by examiner

Cross-sectional view along line A-A

Cross-sectional view along line B-B

Cross-sectional view along line C-C

Cross-sectional view along line A-A

Cross-sectional view along line A-A

Cross-sectional view along line C-C

Cross-sectional view along line C-C

Cross-sectional view along line A-A

Cross-sectional view along line A-A

Cross-sectional view along line A-A

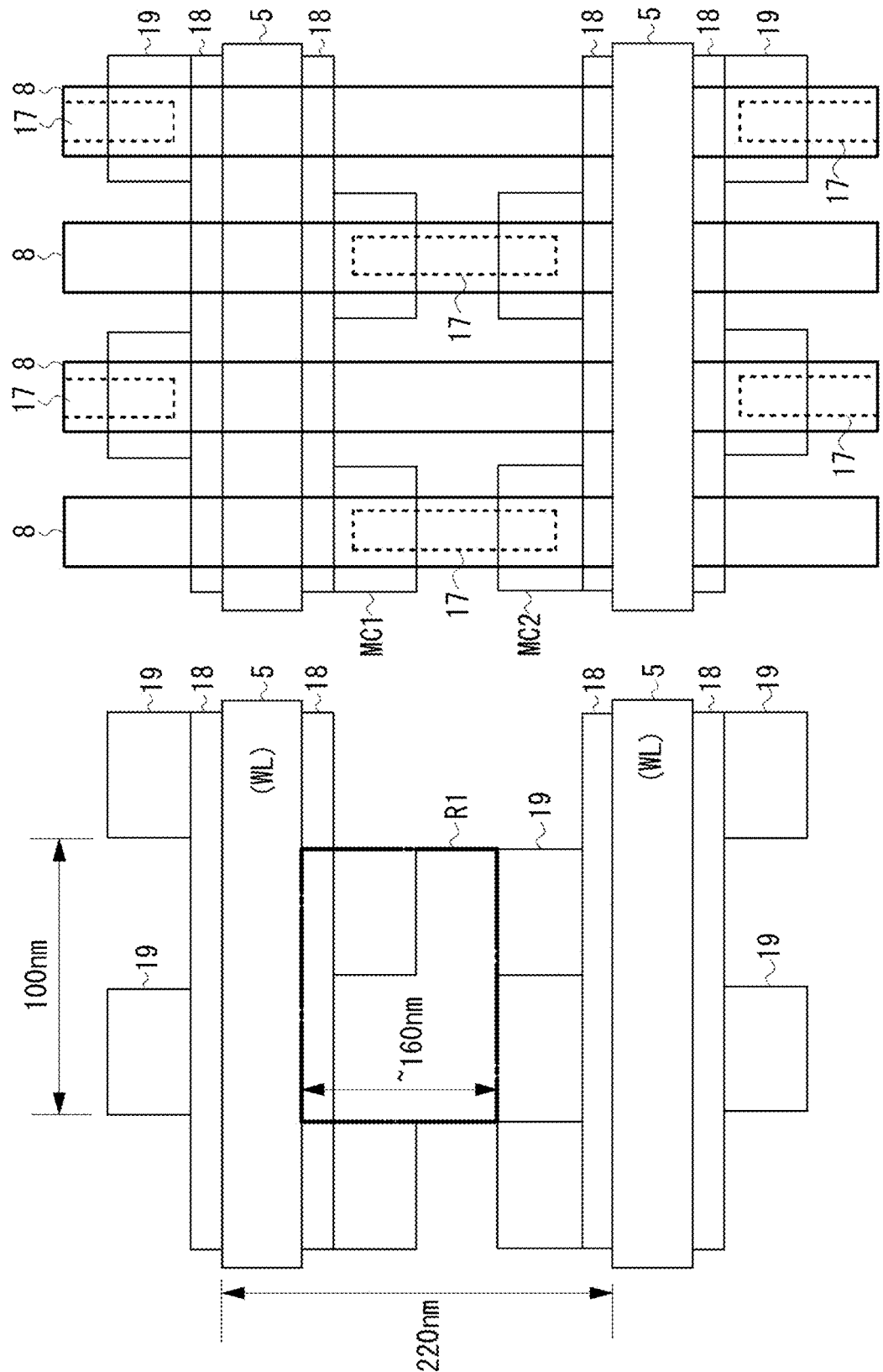

NAND FLASH MEMORY WITH REDUCED PLANAR SIZE

BACKGROUND OF THE INVENTION

1. Field of the Invention

The invention relates to a NAND flash memory, and in particular, to a three-dimensional NAND flash memory and a manufacturing method thereof.

2. Description of Related Art

In recent years, in order to improve the integration of a memory cell, a three-dimensional NAND flash memory of the memory cell that is stacked in a vertical direction is put into practical use. For example, the memory cell is formed by using semiconductor pillars extending in the vertical direction from a substrate (Patent Document 1).
In addition, in Non-Patent Document 1, as shown in FIG. 1, a plurality of rectangular gates are stacked on the substrate, and an insulator including a charge storage layer (for example, a nitride silicon layer) and a channel film are formed in the vertical direction along an end of the gate. The channel film includes polysilicon and is U-shaped. A NAND string includes a U-shaped channel film, an insulator including a charge storage layer, and a gate. One upper end of the channel film is connected to a local source line via a plug, and the other upper end is connected to a bit line via a plug. FIG. 2A is a cross-sectional view when a channel film of a flash memory of FIG. 1 is cut off in a horizontal direction, and FIG. 2B is a cross-sectional view when a channel film is cut off in a vertical direction. A black elliptical part shown in FIG. 2A is a hole formed through etching, and the hole is an insulating region that insulates the channel film formed along a multi-gate. An interval is 100 nm. In addition, an interval between adjacent multi-gates is 220 nm.

RELATED ART

Patent Document

[Patent Document 1] Japanese Patent Application Laid-Open No. 2015-176870
[Non-Patent Document 1] A Novel Double-density, Single-Gate Vertical Channel (SGVC) 3D NAND Flash That Is Tolerant to Deep Vertical Etching CD Variation and Process Robust Read-disturb Immunity, Hang-Ting Lue et al, IEEE International Electron Devices Meeting (IEDM) 15-44, P321-324.

SUMMARY OF THE INVENTION

An objective of the invention is to provide a NAND flash memory capable of reducing the planar size of a memory cell and a manufacturing method thereof compared to the prior art.

The three-dimensional NAND flash memory of the invention includes: a substrate; a lower conductive layer formed in or on the substrate; a plurality of stacks extending in a first direction on the lower conductive layer, and each including stacks of insulators and conductors stacked in a vertical direction from the substrate; a plurality of channel stacks separately arranged along one side of the plurality of stacks and each including an insulating layer including a charge storage layer and a channel film, the insulating layer and the channel film extending in a vertical direction from the substrate, and a lower end of the channel film being electrically connected to the lower conductive layer; and a plurality of strip-shaped upper conductive layers extending in a second direction orthogonal to the first direction, respectively arranged on the plurality of channel stacks, and electrically connected to an upper end of the crossed channel film.

A manufacturing method of a three-dimensional NAND flash memory of the invention includes the following steps. A step of forming a lower conductive layer in or on a substrate. A step of forming a stack by alternately stacking insulators and conductors on the lower conductive layer. A step of etching the stack at a depth reaching the lower conductive layer to form a plurality of stacks extending in a first direction; a step of forming channel stacks on an entire surface of the substrate including the plurality of stacks. A step of etching the channel stacks to separately arrange the channel stacks along one side of each of the plurality of stacks. A step of forming a plurality of strip-shaped upper conductive layers extending in a second direction orthogonal to the first direction on the channel stacks. A step of electrically connecting the plurality of upper conductive layers to an upper end of the crossed channel stack, respectively.

According to the invention, in comparison to the prior art, channel stacks are separately arranged along one side of a stack, and the upper conductive layer is electrically connected to the crossed channel stacks, so that the planar size of a memory cell may be reduced. Therefore, a NAND flash memory with high integration may be obtained.

BRIEF DESCRIPTION OF THE DRAWINGS

FIG. 20A is a top view of an existing NAND flash memory, and schematically shows no bit lines and plugs, and FIG. 20B is a schematic top view showing bit lines and plugs.

DESCRIPTION OF THE EMBODIMENTS

Figure 1:
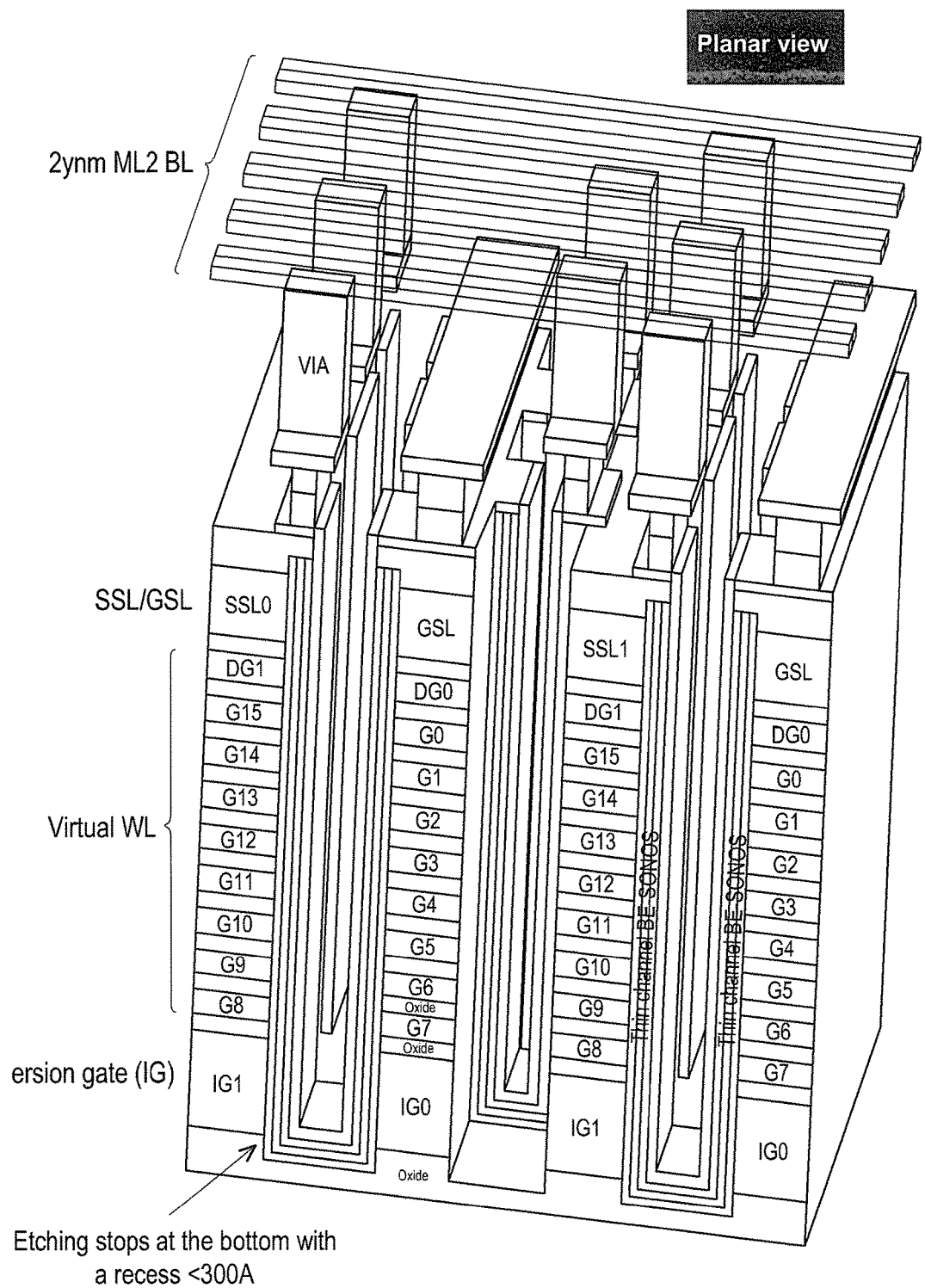
FIG. 1 is a schematic perspective view of an existing three-dimensional NAND flash memory.
Figure 2A:
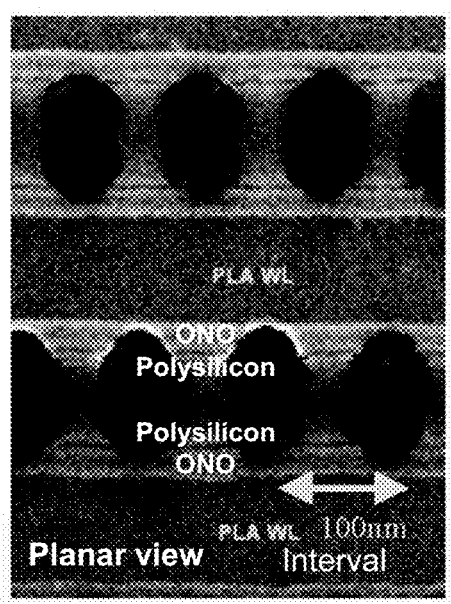
FIG. 2A is a top view of a flash memory shown in FIG. 1.
Figure 2B:
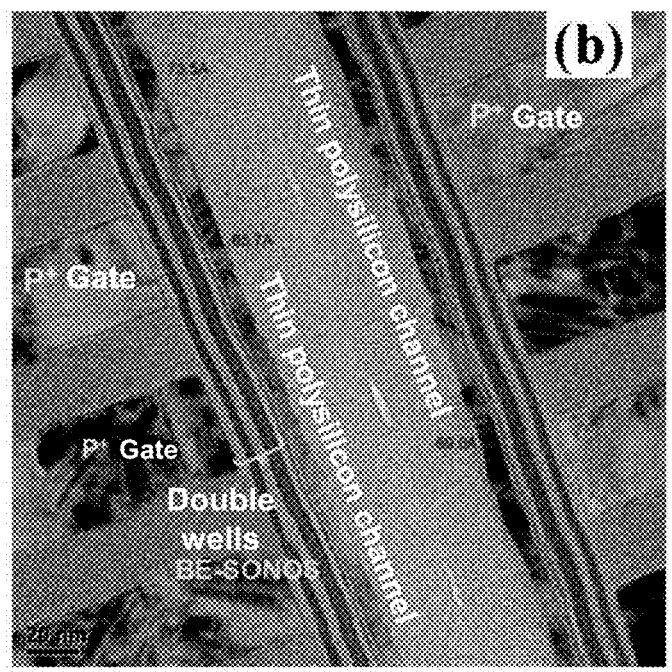
FIG. 2B is a cross-sectional view of a flash memory shown in FIG. 1.

A three-dimensional NAND flash memory of the invention is used as a memory medium for various semiconductor devices (for example, a microcontroller, a microprocessor, and a logic processor embedded in such a flash memory).

Embodiment

Then, the following describes the embodiments of the invention with reference to the accompanying drawings. It should be noted that the proportions in the drawings are exaggerated for ease of understanding and do not necessarily represent actual product proportions.

A NAND flash memory 100 of the present embodiment includes: a substrate 1, an insulating layer 2 formed on the substrate 1, a lower conductive layer 3 formed on the insulating layer 2, a memory cell structure MC stacked on the lower conductive layer 3 in a vertical direction, and a bit line 8 formed on the memory cell structure MC.

The substrate 1 is not particularly limited, and includes, for example, a silicon substrate. The silicon substrate may include any of intrinsic type, n-type, and p-type. In addition, when a peripheral circuit (for example, a column selection drive circuit or an integrated circuit such as a page buffer/readout circuit) is formed on a surface of the silicon substrate, the silicon substrate may include n-type or p-type. In the following description, a case that a silicon substrate is used as a substrate 1 is exemplified.

The insulating layer 2 formed on the silicon substrate 1 includes, for example, a silicon oxide film, a silicon nitride film, or the like. The lower conductive layer 3 includes, for example, n-type polysilicon, or a stack of a metal material and n-type polysilicon. The lower conductive layer 3 functions as a common source SL of a NAND string.

The memory cell structure MC includes a plurality of NAND strings formed on the lower conductive layer 3 in the vertical direction or the longitudinal direction. As is well known, a NAND string includes a plurality of memory cells connected in series, a selection transistor on the bit line side connected to one end of the plurality of memory cells, and a selection transistor on the source line side connected to the other end. Furthermore, the NAND string may also include a virtual memory cell between the selection transistor on the bit line side and the memory cell or between the selection transistor on the source line side and the memory cell.

Figure 3A:
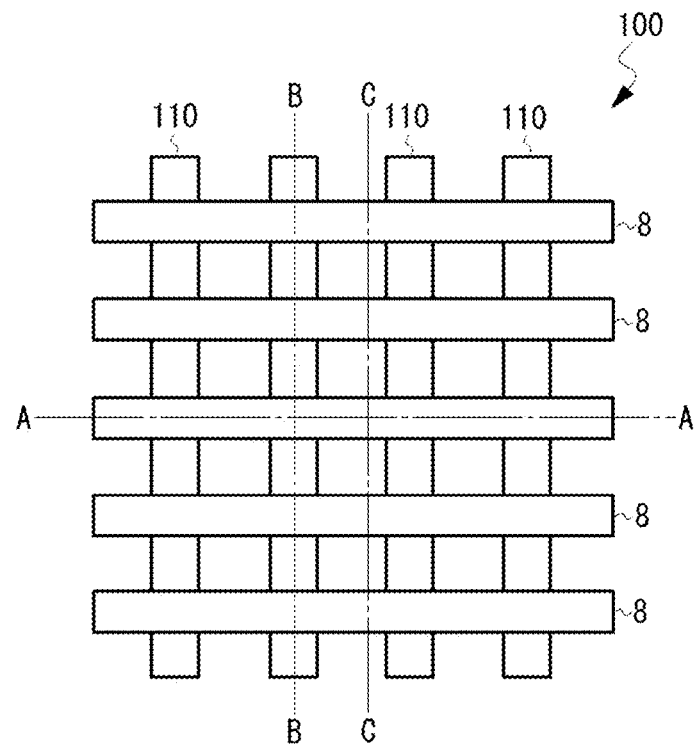
FIG. 3A is a top view of a NAND flash memory according to an embodiment of the invention.
Figure 3B:
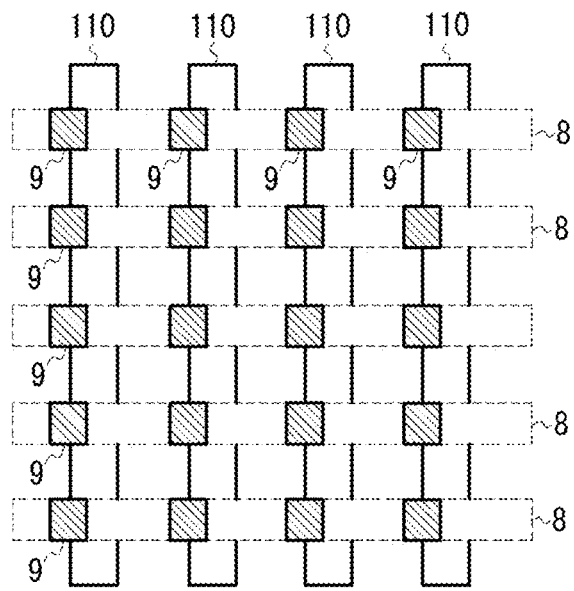
FIG. 3B is a top view showing a positional relationship between a channel stack and a gate stack.

Gate stacks 110 are formed by alternately stacking insulators 4 and conductors 5 on the lower conductive layer 3. As shown in FIG. 3A and FIG. 3B, the gate stacks 110 are processed to be strip-shaped (rectangular in shape) when viewed from a plane, and extend in a stripe shape in a row direction. An uppermost layer of the gate stacks 110 is an insulator 6 connected to a bit line 8 via an insulator 7, and a lowermost layer is an insulator 4 connected to the lower conductive layer 3. The insulator 4 and the insulator 6 include, for example, a silicon oxide film, a silicon nitride film, or the like. A conductor 5A directly below the insulator 6 constitutes a gate of the selection transistor on the bit line side, and a conductor 5B directly above the insulator 4 at the lowermost layer constitutes a gate of the selection transistor on the source line side. A plurality of conductors 5 between the conductor 5A and the conductor 5B respectively constitute gates of the memory cell. The conductor 5, the conductor 5A, and the conductor 5B include, for example, n-type polycrystalline silicon. The conductor 5A that constitutes the gate of the selection transistor on the bit line side is connected to one or more selection gate lines SGD generated by a column selection drive circuit or the like not shown. The conductor 5B constituting the gate of the selection transistor on the source line side is connected to one or more selection gate lines SGS generated by the same column selection drive circuit or the like, and the plurality of conductors 5 are connected to corresponding word lines WL.

Figure 4:
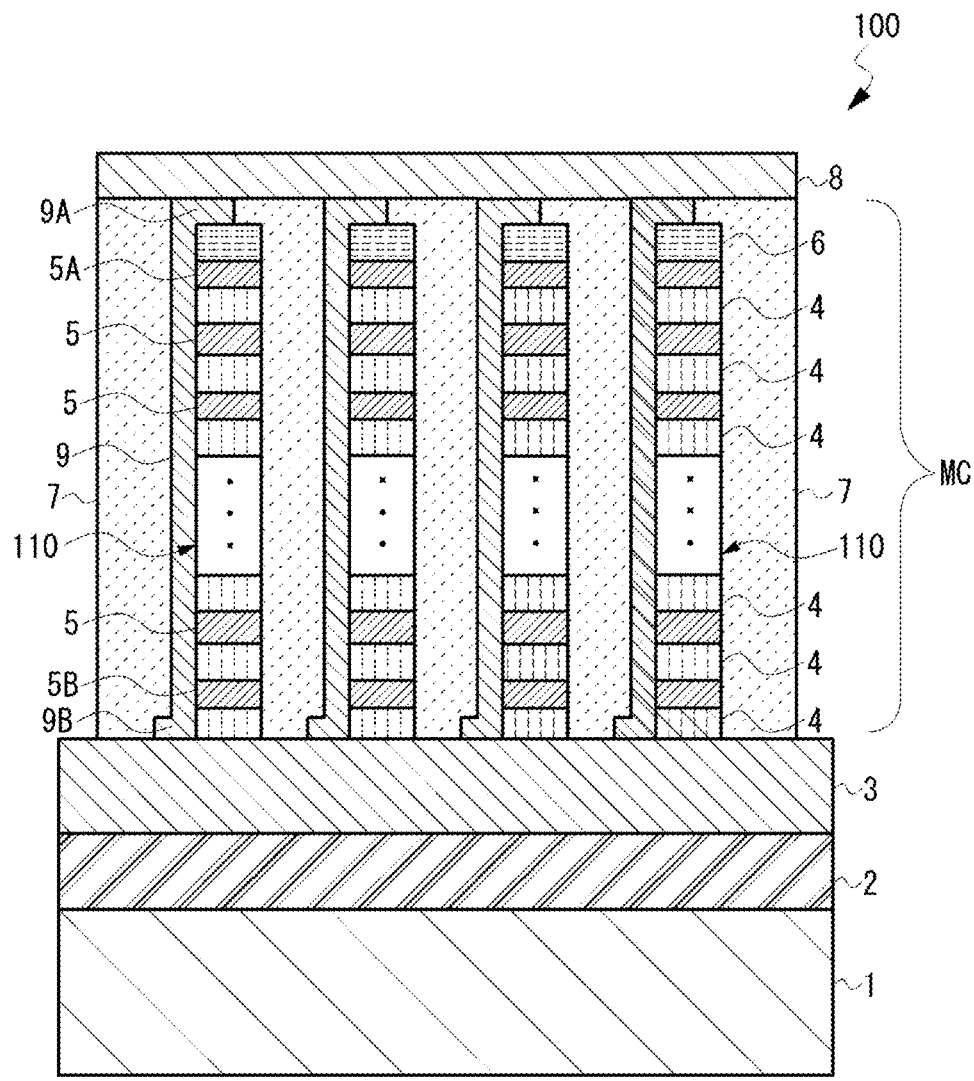
FIG. 4 is a schematic cross-sectional view of a NAND flash memory taken along line A-A according to an embodiment of the invention.
Figure 5:
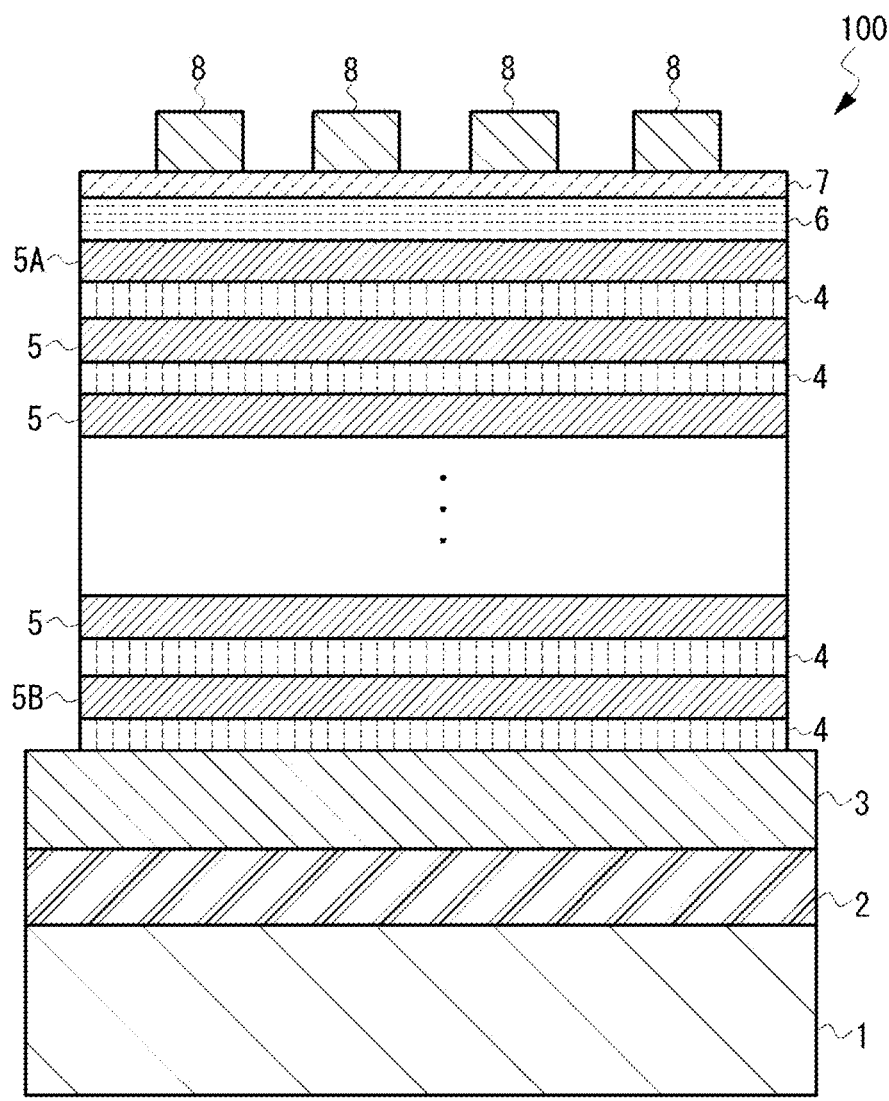
FIG. 5 is a schematic cross-sectional view of a NAND flash memory taken along line B-B according to an embodiment of the invention.
Figure 6:
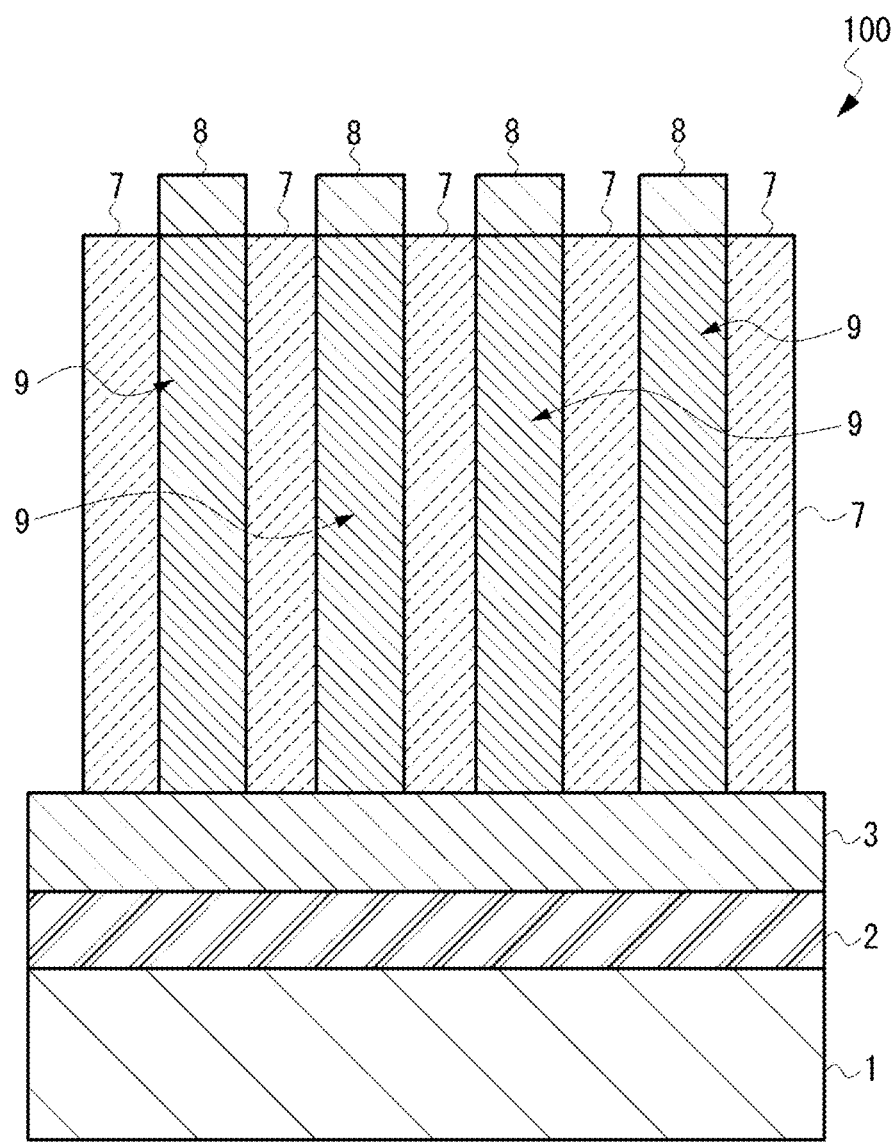
FIG. 6 is a schematic cross-sectional view of a NAND flash memory taken along line C-C according to an embodiment of the invention.

The memory cell structure MC further includes channel stacks 9. As shown in FIG. 3B, FIG. 4, and FIG. 6, the channel stacks 9 are formed separately in the row direction in such a manner as to follow one side of the gate stacks 110. A channel stack 9 extends from the lower conductive layer 3 to the bit line 8 in the vertical direction. An upper end 9A of the channel stack 9 is connected to crossed bit lines 8, and a lower end 9B is connected to the lower conductive layer 3. In this example, the upper end 9A of the channel stack 9 is formed to cover a part of the insulator 6 of the gate stacks 110. In this way, a contact area between the channel stack 9 and the bit line 8 may be increased. However, such composition is an example and is not limited thereto.

One NAND string includes one channel stack 9 extending in the vertical direction. The channel stack 9 includes a channel film constituting a channel and a gate insulator formed between the channel film and the gate 5. The channel film includes polysilicon, for example. The gate insulator includes a charge storage layer that stores charges and a plurality of insulating layers sandwiching the charge storage layer. The gate insulator may be, for example, an ONO structure of silicon oxide film (O)/silicon nitride film (N)/silicon oxide film (O). Other semiconductor materials with a high dielectric constant may be used instead of the silicon oxide film. In addition, details of the channel stack 9 are to be described later.

As described above, on one side of the gate stacks 110, the plurality of channel stacks 9 are formed separately, and the insulator 7 is formed between the channel stacks 9. Furthermore, an insulator 7 is also formed on the other side of the gate stacks 110. In other words, space between two adjacent gate stacks is filled with the insulator 7.

As shown in FIG. 3A, on the top of the memory cell structure MC, a plurality of bit lines 8 processed to be strip-shaped (rectangular in shape) when viewed from a plane extend in a stripe shape in the column direction. The plurality of bit lines 8 are respectively electrically connected to the upper end 9A of the channel stack 9 corresponding to a position crossing the gate stack 110. The bit line 8 includes, for example, a metal material such as polysilicon, aluminium (Al), or the like.

Figure 7:
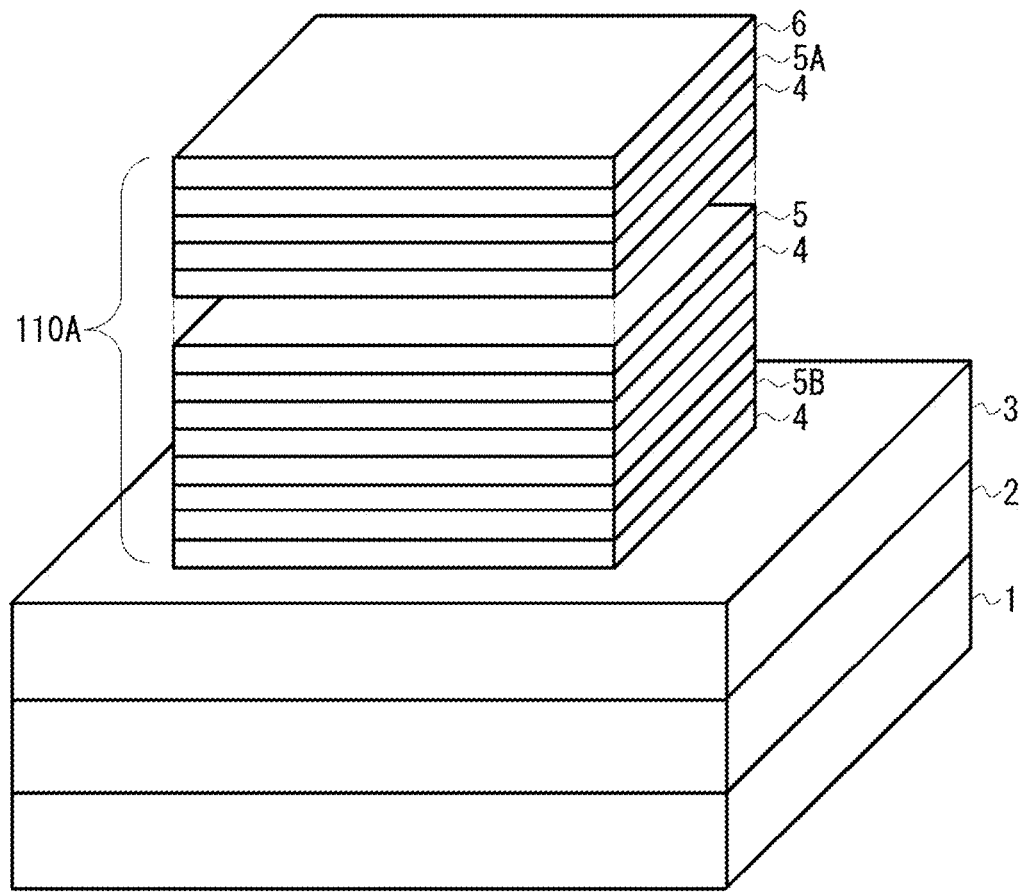
FIG. 7 is a schematic perspective view showing manufacturing steps of a NAND flash memory according to an embodiment of the invention.

Next, the manufacturing method of the NAND flash memory of the present embodiment is described with reference to FIG. 7 to FIG. 18. First, as shown in FIG. 7, an insulating layer 2 is formed on a substrate 1, and a lower conductive layer 3 is formed on the insulating layer 2. Next, a stack 110A including a stack of an insulator 4, an insulator 6, and a conductor 5 is formed on the lower conductive layer 3. The stack 110A is a precursor of the gate stack 110. A number of conductors 5 stacked by the stack 110A is determined according to a number (for example, 32 or 64) of memory cells of a NAND string.

Figure 8:
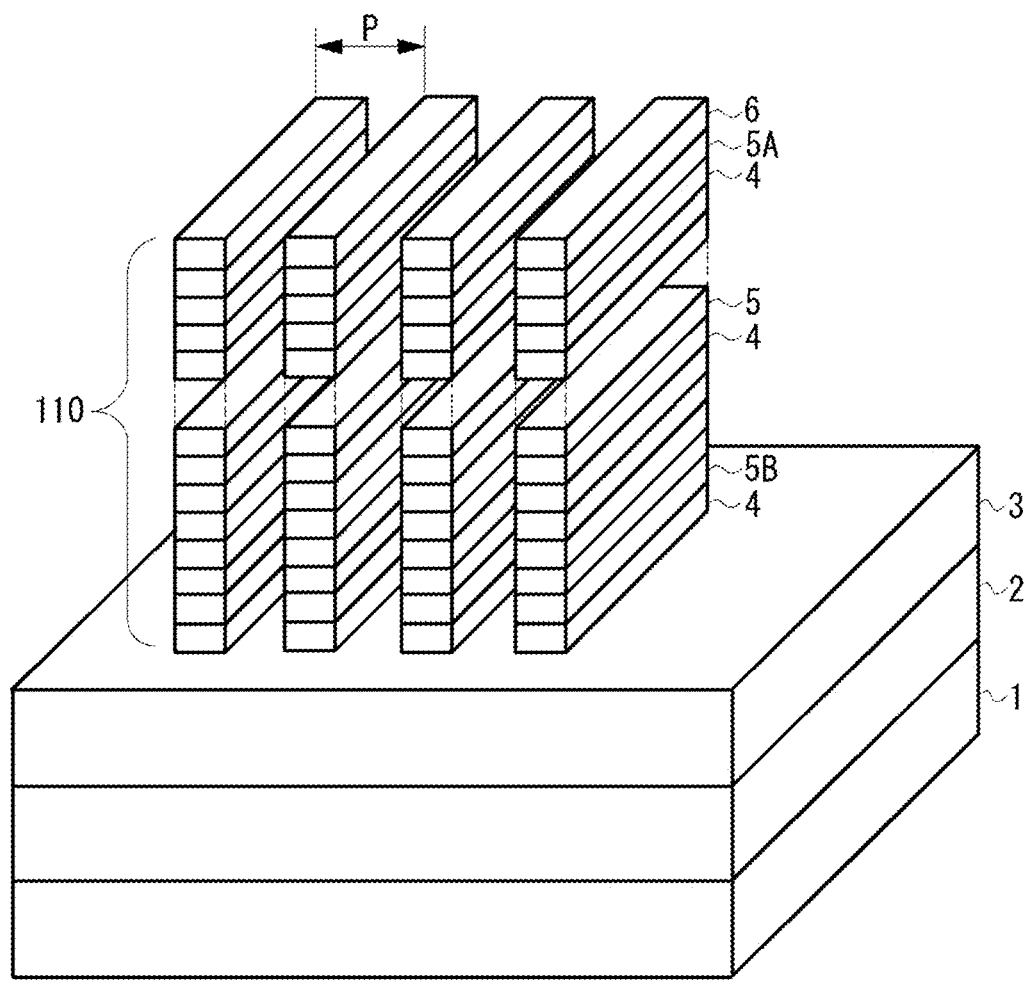
FIG. 8 is a schematic perspective view showing manufacturing steps of a NAND flash memory according to an embodiment of the invention.
Figure 9:
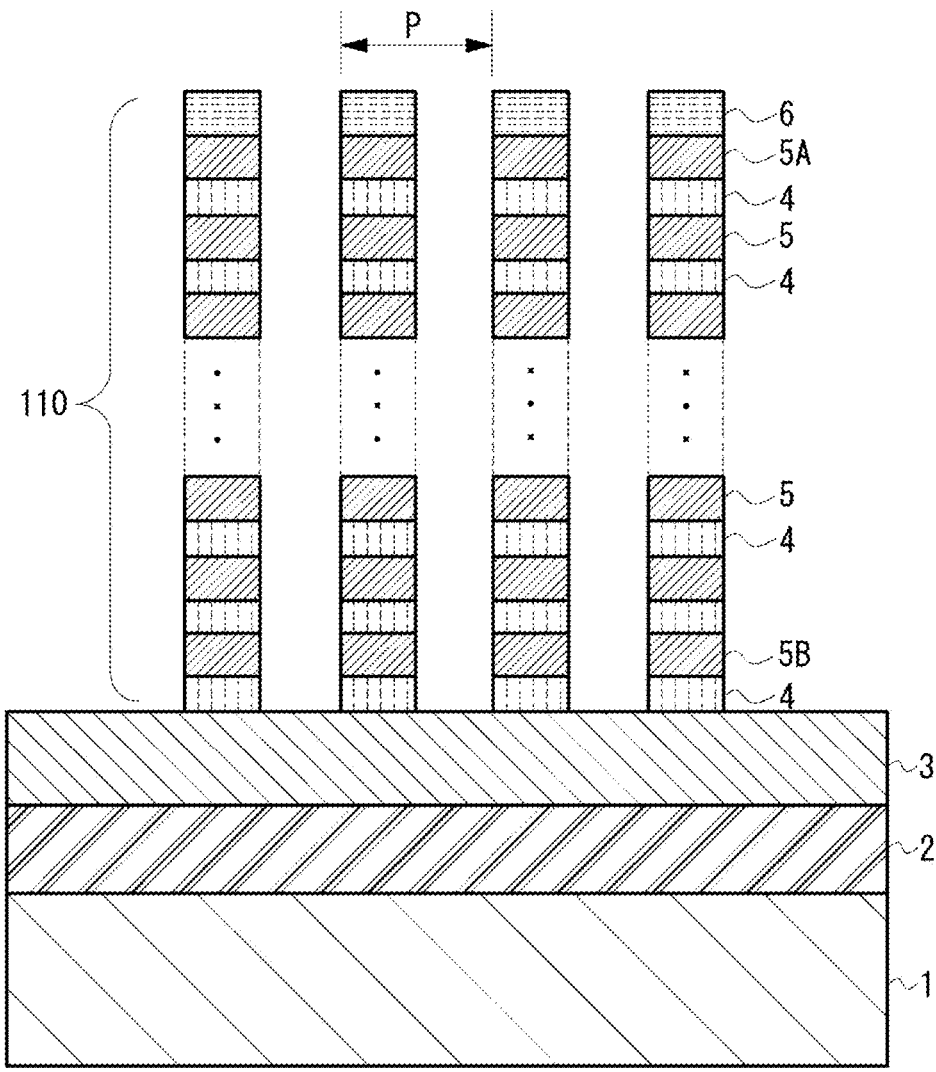
FIG. 9 is a schematic cross-sectional view showing manufacturing steps of a NAND flash memory taken along line A-A according to an embodiment of the invention.

Next, a patterned etching mask (not shown) is formed on the insulator 6 through photolithography, and the insulator 4, the insulator 6, and the conductor 5 of the stack 110A are simultaneously anisotropically etched by using the etching mask. The etching is performed until reaching the lower conductive layer 3. The etching is performed by, for example, anisotropic etching or a combination of anisotropic etching and isotropic etching. On the surface of the lower conductive layer 3, micro steps or recesses removed by etching may be formed. It is desirable that the lower conductive layer 3 has a sufficiently large film thickness for such steps or recesses. In this way, as shown in FIG. 8, a strip-shaped gate stack 110 extending in the row direction is formed on the lower conductive layer 3. An interval between the gate stacks 110 is, for example, 180 nm. FIG. 9 is a cross-sectional view taken along line A-A (line A-A is the same position as line A-A in FIG. 3A).

Figure 10:
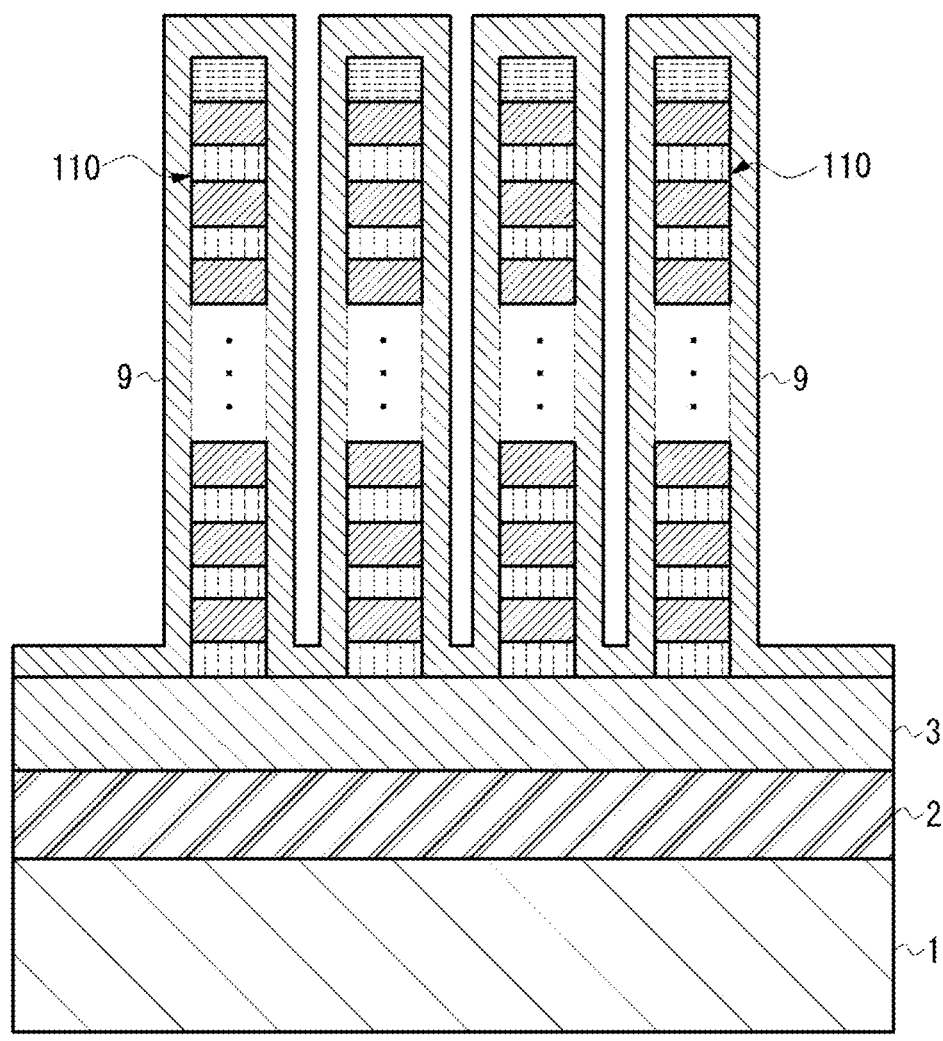
FIG. 10 is a schematic cross-sectional view of manufacturing steps of a NAND flash memory taken along line A-A according to an embodiment of the invention.
Figure 10A:
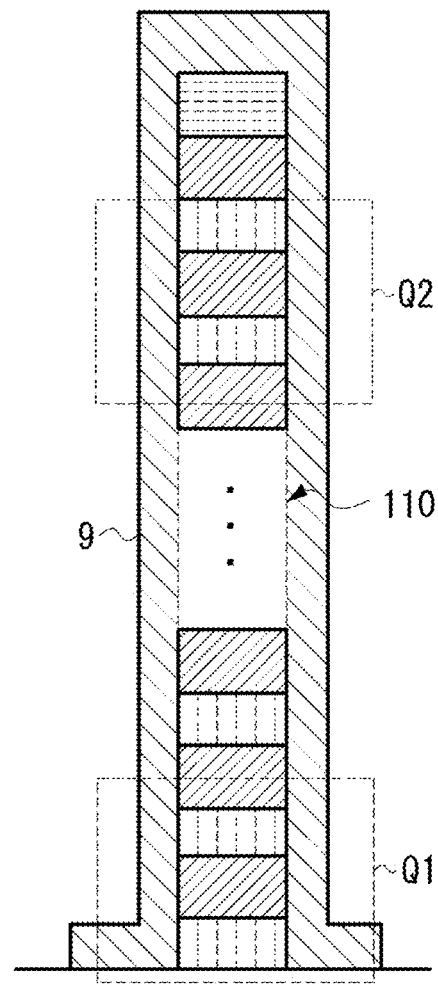
FIG. 10A is a schematic cross-sectional view showing manufacturing steps of a channel stack shown in FIG. 10.

Next, as shown in FIG. 10, the channel stack 9 is formed on an entire surface of the substrate to cover the gate stack 110. The structure of the channel stack 9 is described with reference to FIG. 10A to FIG. 10D. The enlarged cross-sectional views of FIG. 10B to FIG. 10D correspond to the regions Q1 and Q2 shown in FIG. 10A, respectively.

Figure 10B:
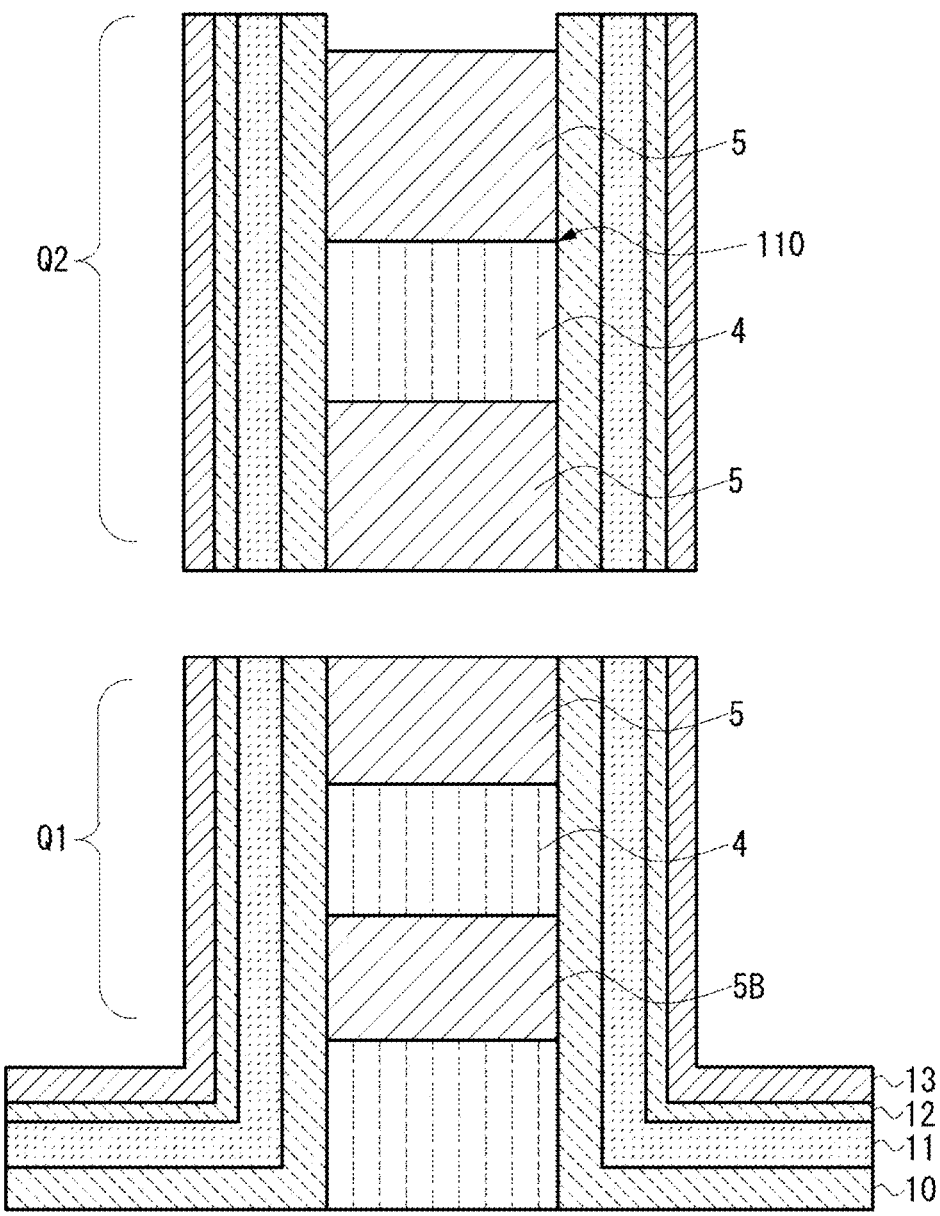
FIG. 10B is a schematic cross-sectional view showing manufacturing steps of a channel stack shown in FIG. 10.

As shown in FIG. 10B, an insulating layer 10, a charge storage layer 11, an insulating layer 12, and a polysilicon layer 13 are sequentially stacked on the entire surface of the substrate to cover the gate stack 110. The method for forming these films is not particularly limited, and for example, chemical vapor deposition (CVD) or sputtering may be used. The insulating layer 12 includes silicon dioxide ($SiO_2$), or a stack of silicon dioxide ($SiO_2$) and silicon nitride (SiN). The charge storage layer 11 includes several insulators, for example, a stack including silicon nitride (SiN) or silicon dioxide ($SiO_2$) capable of storing charges. The insulating layer 10 includes several insulators such as a high dielectric constant (High K, Hi K) material with a high dielectric constant. The polysilicon layer 13 is not doped, and therefore includes intrinsic silicon.

Figure 10C:
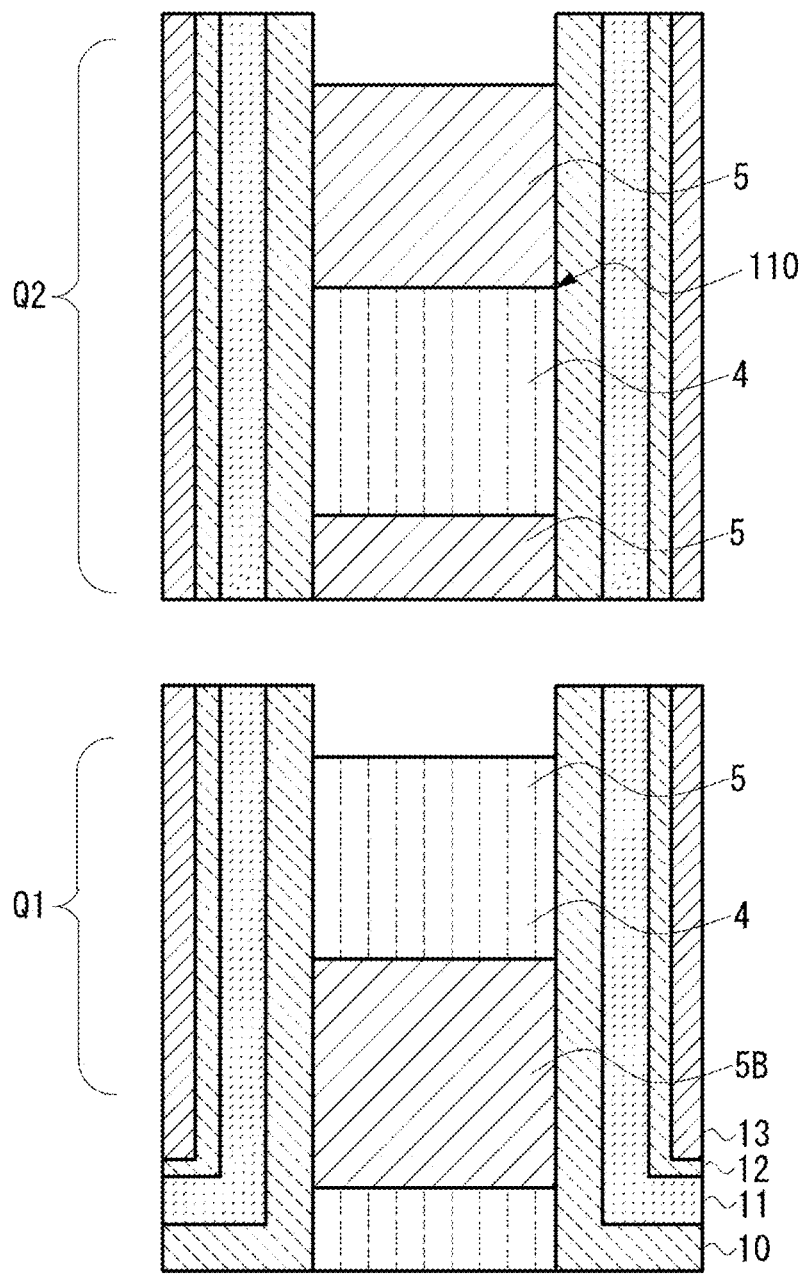
FIG. 10C is a schematic cross-sectional view showing manufacturing steps of a channel stack shown in FIG. 10.
Figure 10D:
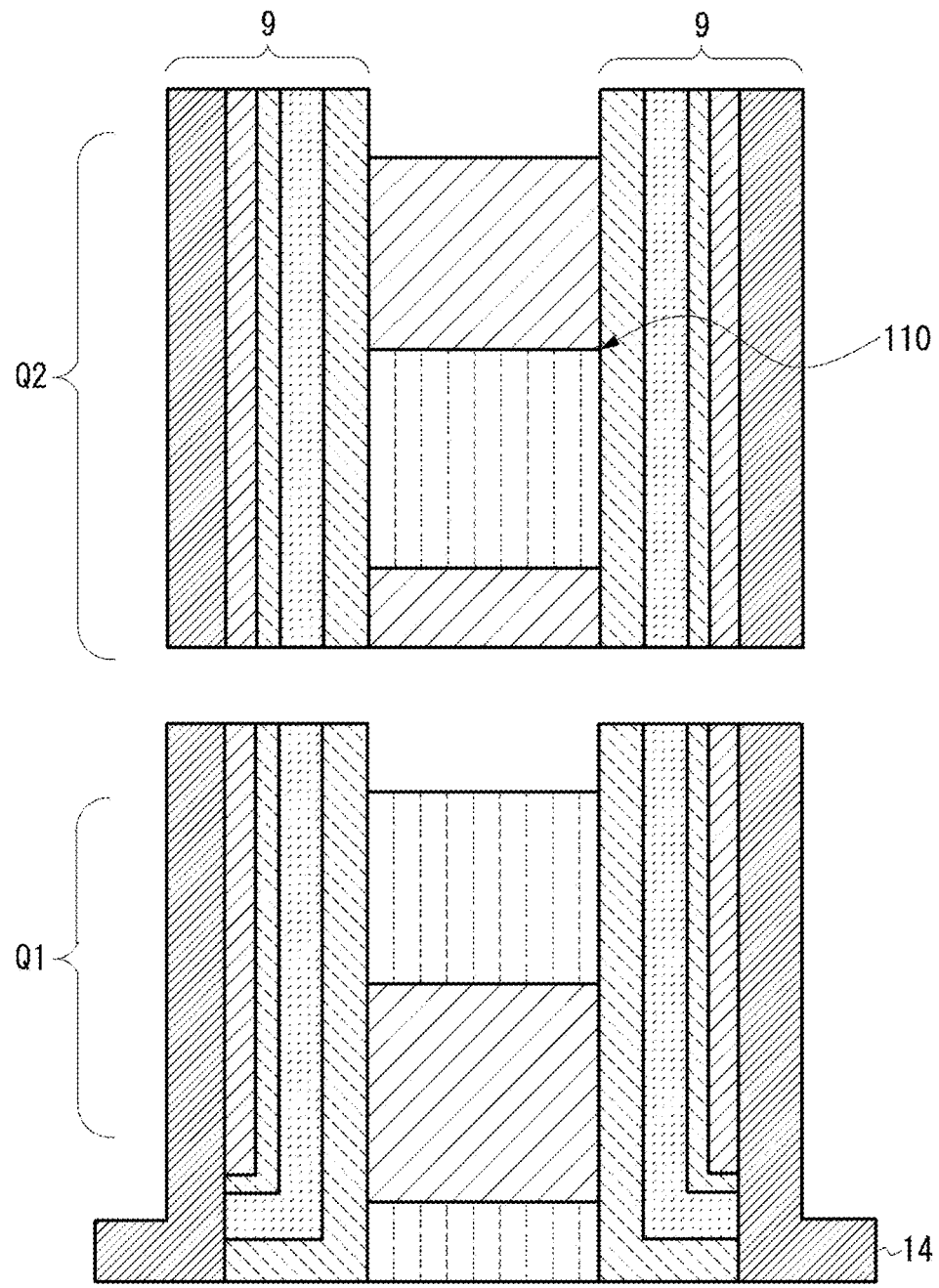
FIG. 10D is a schematic cross-sectional view showing manufacturing steps of a channel stack shown in FIG. 10.
Figure 11:
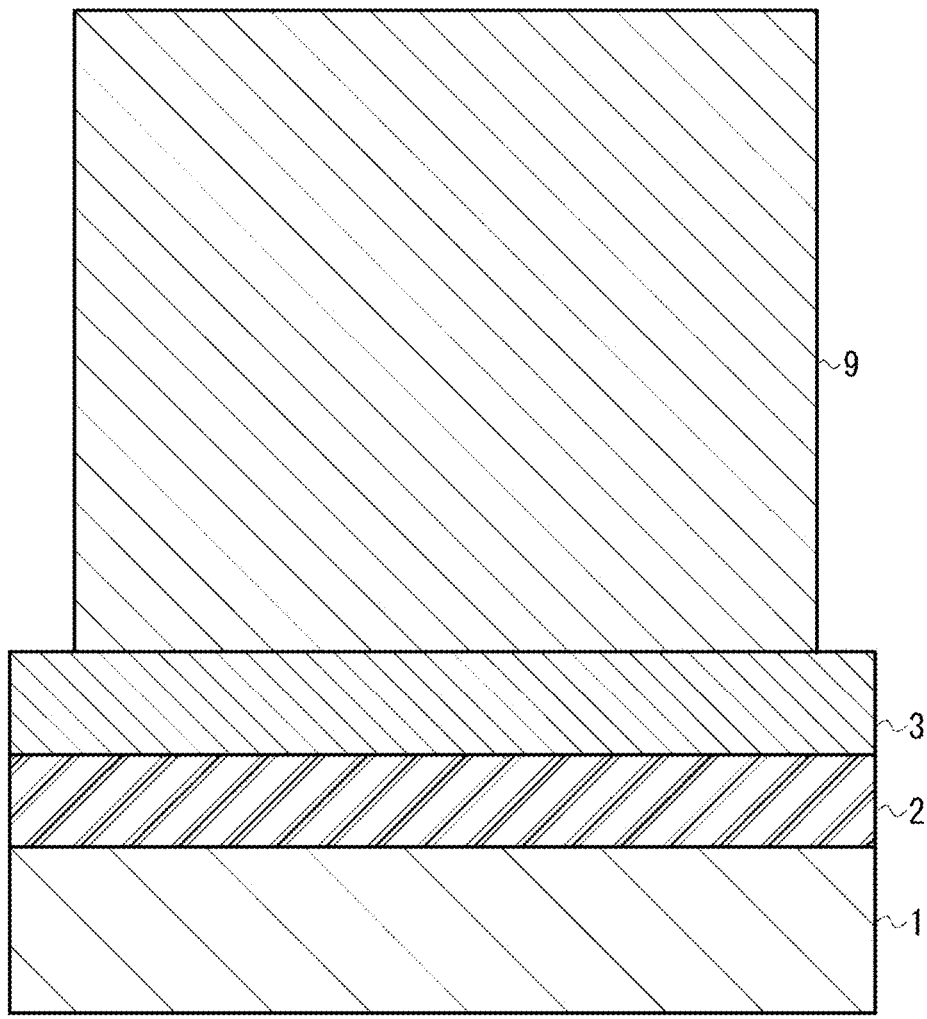
FIG. 11 is a schematic cross-sectional view showing manufacturing steps of a NAND flash memory taken along line C-C according to an embodiment of the invention.

Next, as shown in FIG. 10C, bottoms of the insulating layer 10, the charge storage layer 11, the insulating layer 12, and the polysilicon layer 13 are etched by using an etching mask not shown herein. The etching is performed by, for example, anisotropic etching or a combination of anisotropic etching and isotropic etching until the surface of the lower conductive layer 3 is exposed. On the surface of the lower conductive layer 3, micro steps or recesses removed by etching may be formed. It is desirable that the lower conductive layer 3 has a sufficiently large film thickness for such steps or recesses. Next, as shown in FIG. 10D, a polysilicon layer 14 is stored on the entire surface of the substrate. The polysilicon layer 14 is not doped either and therefore is intrinsic silicon. The two polysilicon layers 13 and 14 are electrically connected to each other, and the lower end of the polysilicon layer 14 is electrically connected to the lower conductive layer 3. In this way, channel stacks 9 are formed to cover two sides of the gate stacks 110. FIG. 11 is a cross-sectional view taken along line C-C the same position as line C-C in FIG. 3A.

Figure 12:
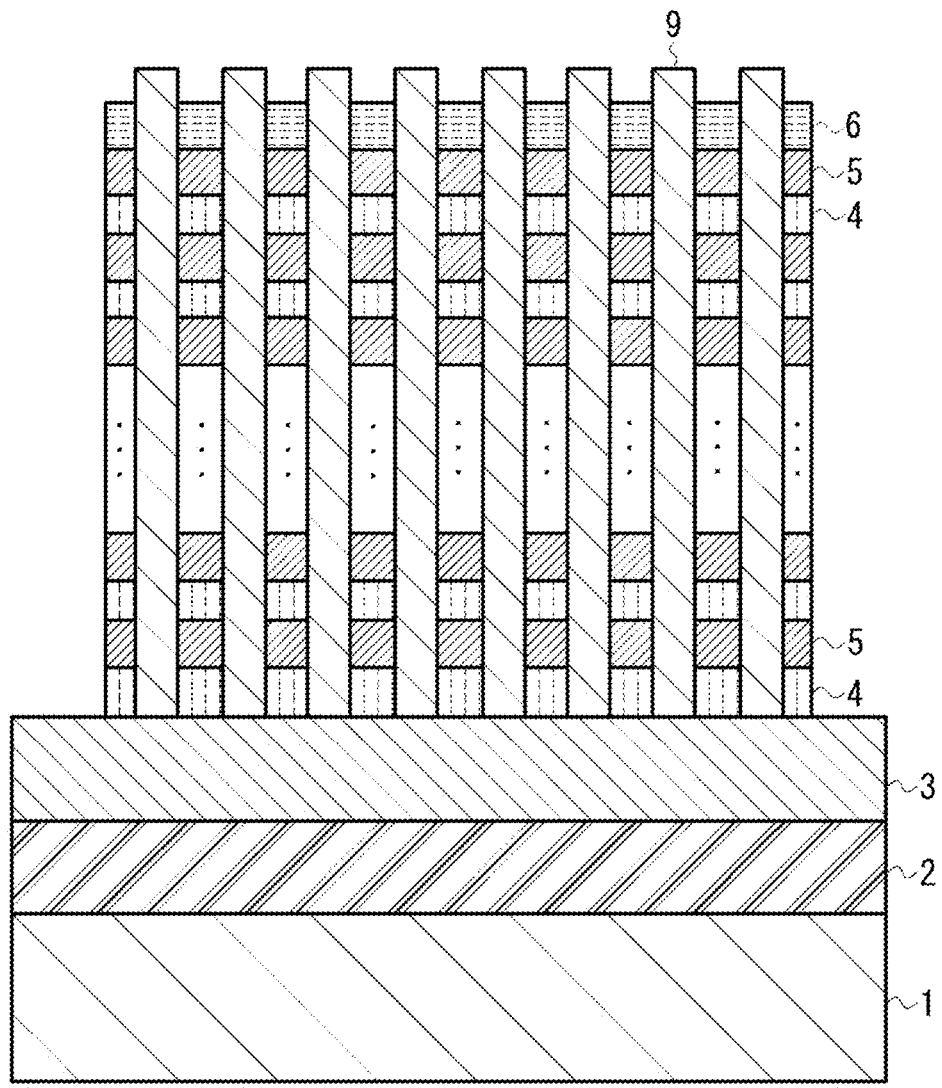
FIG. 12 is a schematic cross-sectional view showing manufacturing steps of a NAND flash memory taken along line C-C according to an embodiment of the invention.
Figure 13:
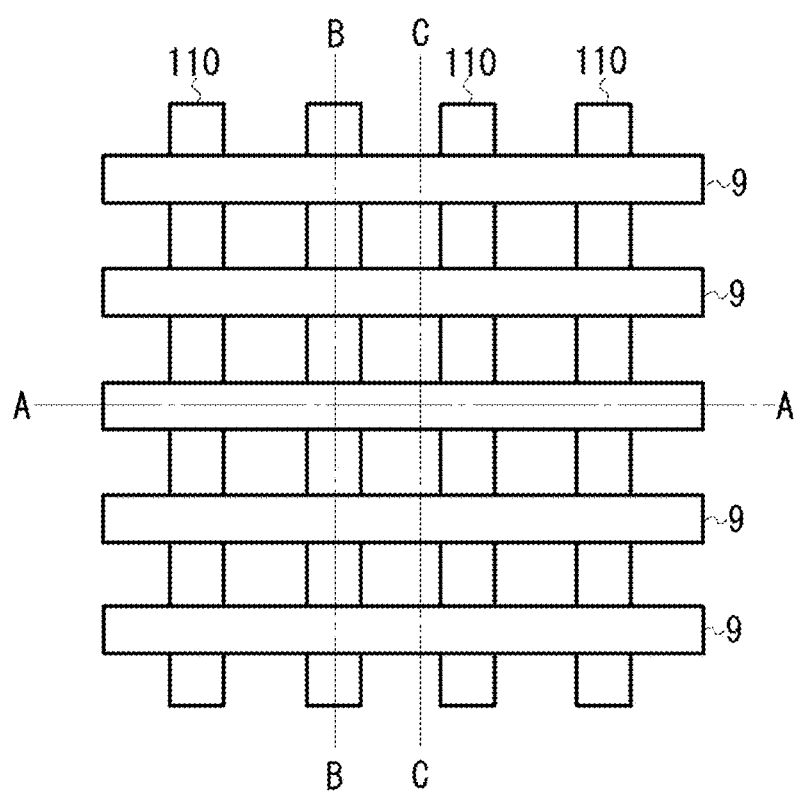
FIG. 13 is a schematic cross-sectional view showing manufacturing steps of a NAND flash memory taken along line C-C according to an embodiment of the invention.

Next, as shown in FIG. 12, the channel stacks 9 are processed into a plurality of stripes by etching to form a plurality of channel stacks 9 insulated from each other. As shown in FIG. 13, one channel stack 9 extends in a direction orthogonal to a direction in which a gate insulator 110 extends, and the plurality of channel stacks 9 are separately arranged at a certain interval in the direction in which the gate insulator 110 extends.

Figure 14:
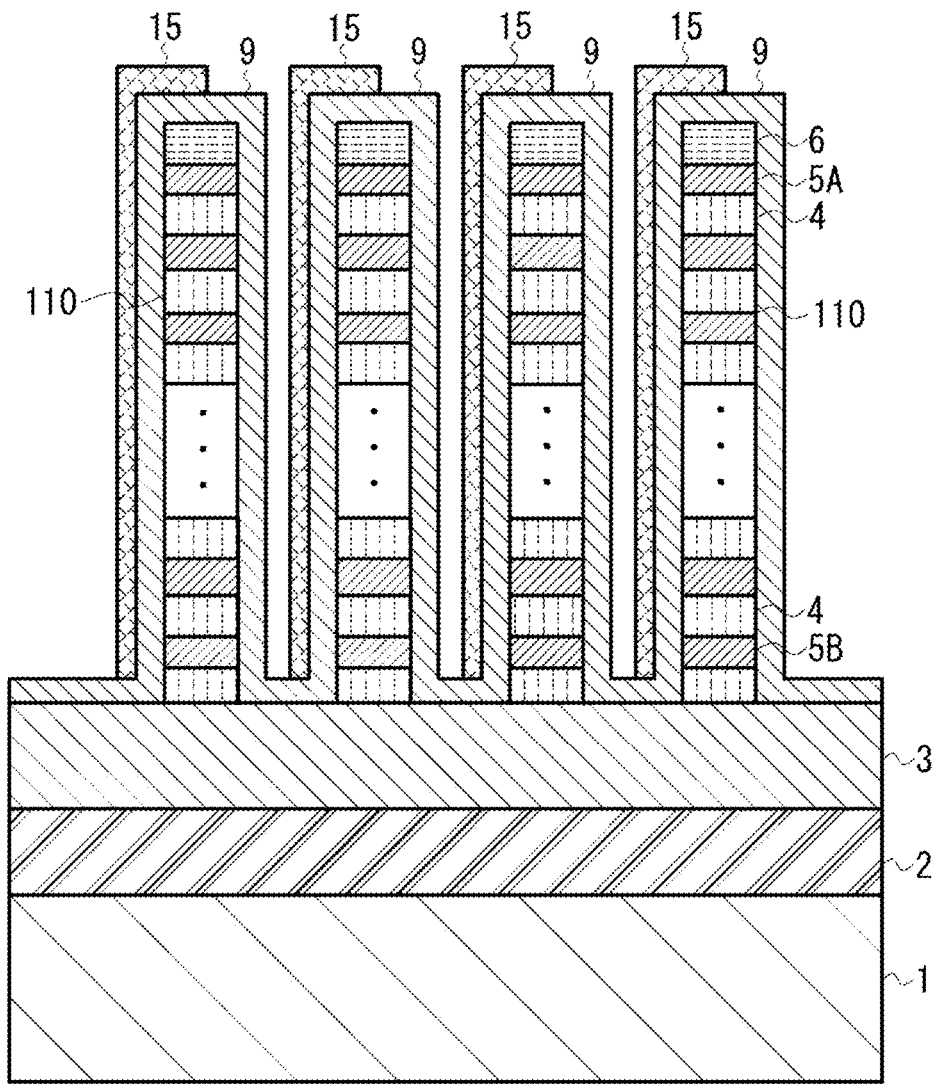
FIG. 14 is a schematic cross-sectional view showing manufacturing steps of a NAND flash memory taken along line A-A according to an embodiment of the invention.
Figure 15:
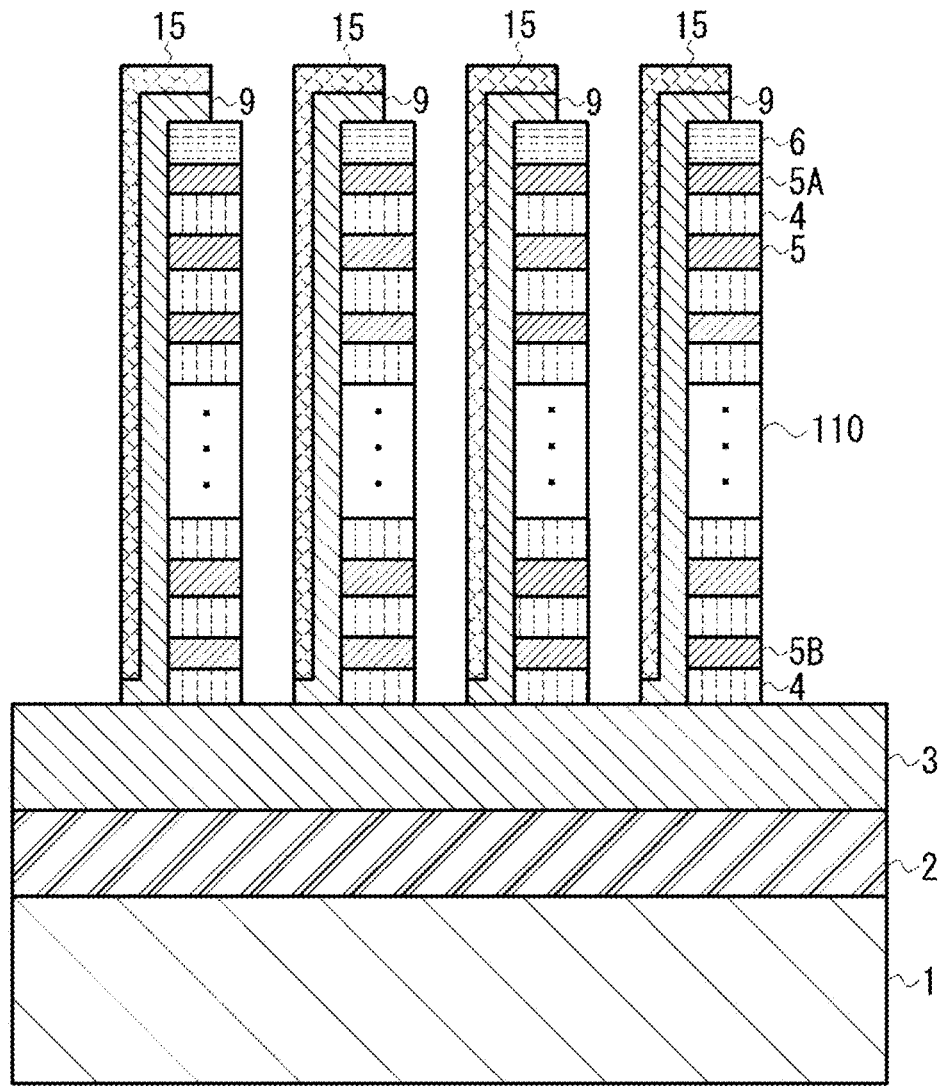
FIG. 15 is a schematic cross-sectional view showing manufacturing steps of a NAND flash memory taken along line A-A according to an embodiment of the invention.
Figure 16:
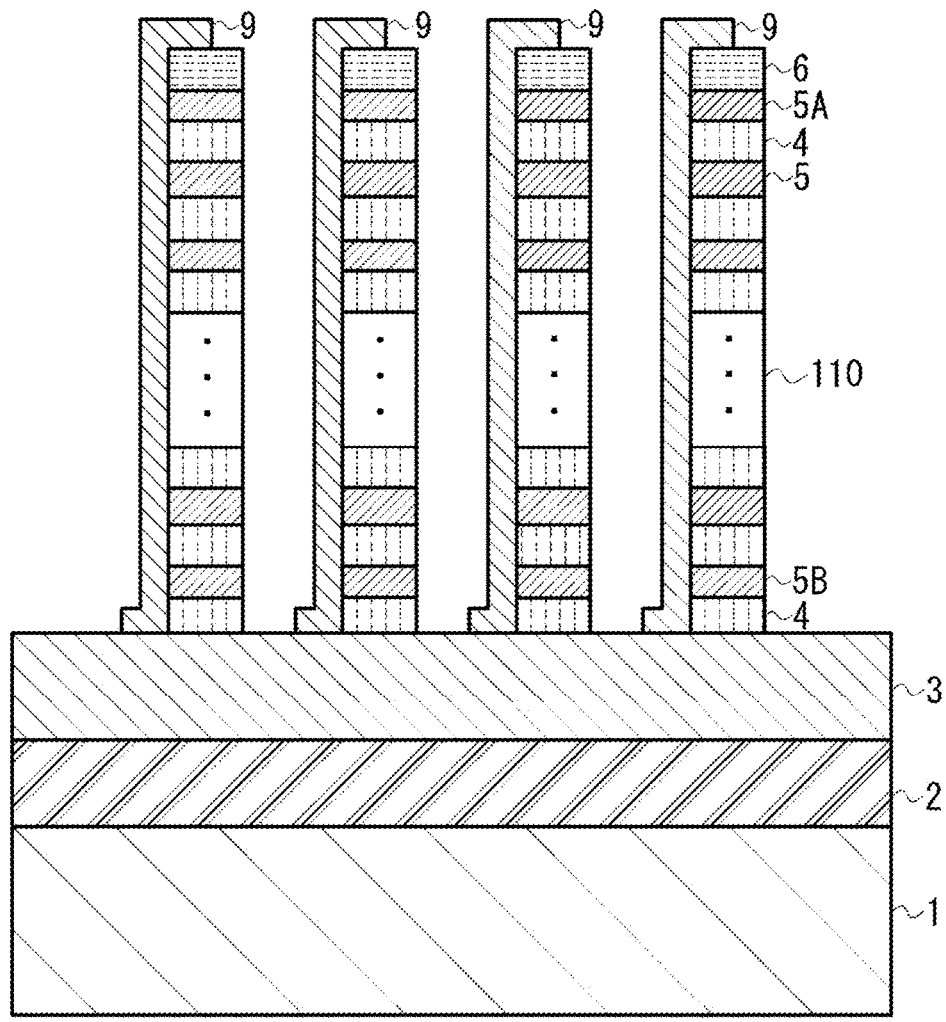
FIG. 16 is a schematic cross-sectional view showing manufacturing steps of a NAND flash memory taken along line A-A according to an embodiment of the invention.

Next, the channel stack 9 is further processed along one side of the gate insulator 110. The processing flow is shown in FIG. 14 to FIG. 16. Moreover, FIG. 14 to FIG. 16 are each a schematic cross-sectional view along a line A-A of FIG. 13. As shown in FIG. 14, a patterned etching mask 15 is formed through photolithography to cover a part of side and upper surfaces of the channel stack 9.

Next, as shown in FIG. 15, the channel stack 9 is partially removed for etching via the etching mask 15. The etching is performed by, for example, anisotropic etching or a combination of anisotropic etching and isotropic etching until the surface of the lower conductive layer 3 is exposed. On the surface of the lower conductive layer 3, micro steps or recesses removed by etching may be formed. It is desirable that the lower conductive layer 3 has a sufficiently large film thickness for such steps or recesses. Through the etching, the channel stack 9 remains on one side of the gate insulator 110 and covers a part of the insulator 6 of the gate stack 110. In order to increase the contact area between the channel stack with the bit line 8 or the area for forming a contact hole connected to the bit line, the channel stack 9 is formed to cover the insulator 6. In addition, the bottom of the channel stack 9 is separated from the bottom of the channel stack 9 of the adjacent gate stacks 110, so that the lower conductive layer 3 is exposed.

Next, as shown in FIG. 16, the etching mask 15 is removed. After the etching mask 15 is removed, an intermediate insulator 7 is stored on an entire surface of the substrate to cover the channel stack 9 and the gate stack 110. Accordingly, space between adjacent gate stacks 110 is filled with the intermediate insulator 7.

Figure 17:
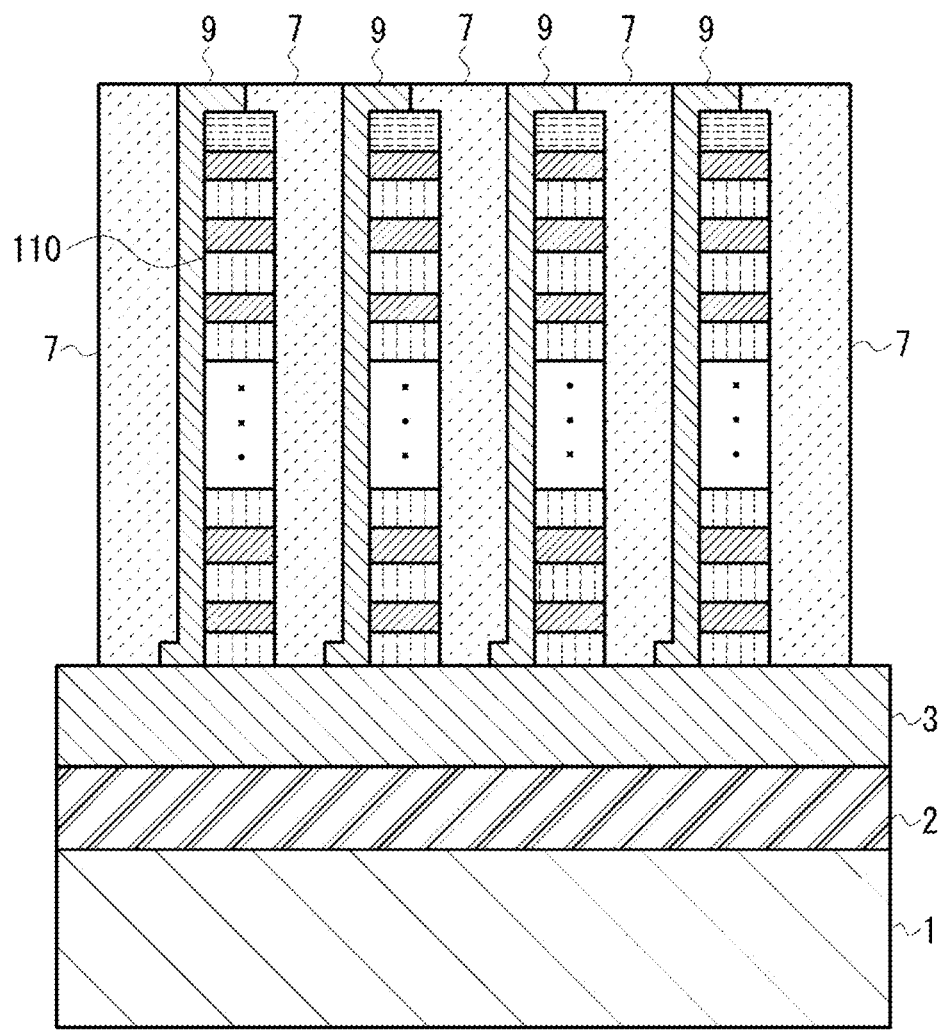
FIG. 17 is a schematic cross-sectional view showing manufacturing steps of a NAND flash memory taken along line A-A according to an embodiment of the invention.

Next, as shown in FIG. 17, chemical mechanical planarization (CMP) or the like is performed on the intermediate insulator 7. Through the planarization process, the top of the channel stack 9 is exposed.

Figure 18:
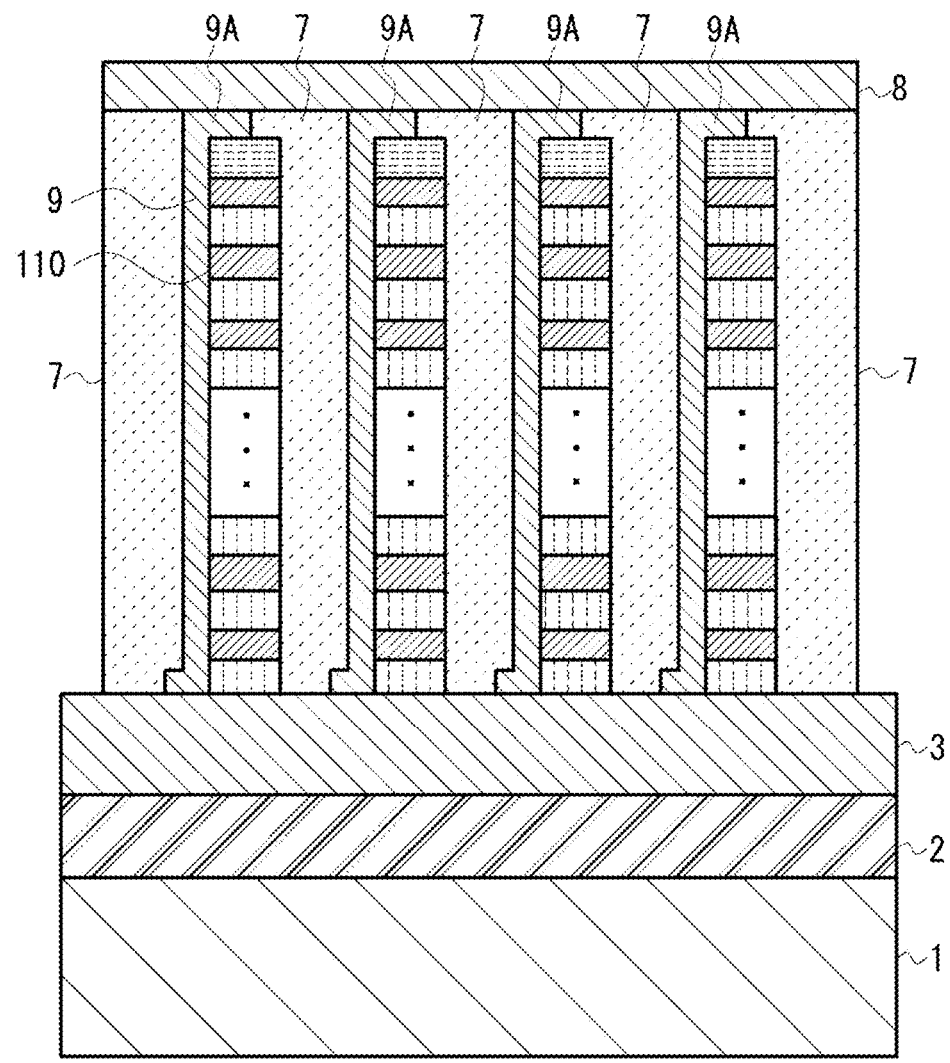
FIG. 18 is a schematic cross-sectional view showing manufacturing steps of a NAND flash memory taken along line A-A according to an embodiment of the invention.

Next, as shown in FIG. 18, materials of bit lines are stored on the entire surface of the substrate, and then the bit line 8 is patterned into a strip shape. The bit line 8 is electrically connected to a polysilicon layer 13 and a polysilicon layer 14 of the channel stack 9 that are crossed directly below the bit line. For example herein, the bit line 8 is in direct contact with the upper end 9A of the channel stack 9, but an interlayer insulating film may be formed after planarization processing, and a contact hole may be formed in the interlayer insulating film to expose the upper end 9A of the channel stack 9, so that the bit line 8 is electrically connected to the channel stack 9 via the contact hole.

In this way, a NAND string connected between the bit line 8 and the lower conductive layer (source) 3 is formed to obtain a three-dimensional memory cell array.

Figure 19A:
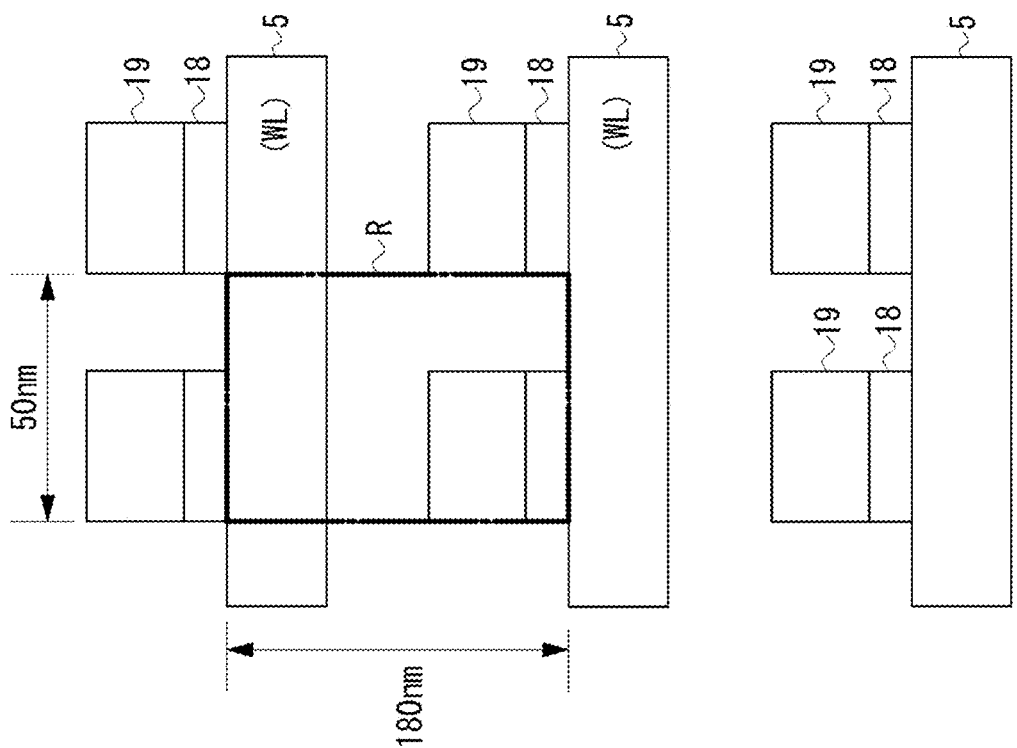
FIG. 19A is a top view of a NAND flash memory according to an embodiment of the invention, and schematically shows no bit lines and contacts.
Figure 19B:
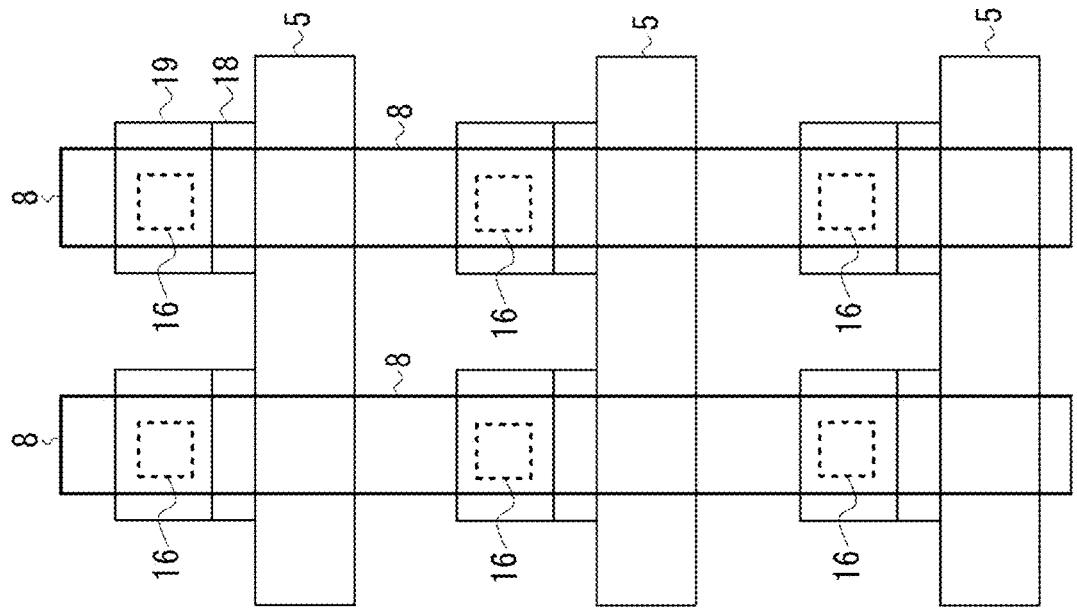
FIG. 19B is a schematic top view showing bit lines and contacts.

Next, the cell size of the three-dimensional NAND flash memory of the present embodiment is compared with the cell size of existing products. FIG. 19B is a schematic top view of a flash memory of the present embodiment, and FIG. 19A is a schematic top view showing no bit line 8 and bit line (BL) contact 16 between the bit line 8 and a channel film 19. In these figures, 18 represents a gate insulating film (an insulator 10, an insulator 11, and an insulator 12 shown in FIG. 10B), and 19 represents a channel film (polysilicon 13 and polysilicon 14 shown in FIG. 10D). In addition, a rectangular region R shown by the dashed lines represents the planar size of one memory cell. When an interval of the gate electrode 5 is 180 nm and an interval of the channel film 19 is 50 nm, the planar size R is 50×180 nm2.

In addition, FIG. 20B is a schematic top view of an existing memory cell of the non-patent document 1, and FIG. 20A is a schematic top view showing no bit line 8 and plug 17 for contact between the bit line 8 and a channel film 19. The rectangular region R1 represents the planar size of one memory cell, which is represented by the same scale as that in FIG. 20A.

In the existing memory cell structure, two memory cells are formed on both sides of the gate 5, and the bit lines 8 is connected to the two memory cells facing each other in a shared manner. For example, the two memory cells MC1 and MC2 are connected to the bit lines 8 via the plug 17. In order to cause the two memory cells to operate individually, the bit lines 8 connected to the two memory cells are required to be separated from each other. On the contrary, in the memory cell structure of the present embodiment, the memory cell is only arranged on one side of the gate 5. Therefore, the bit lines 8 connected to the two memory cells may be shared. According to such differences, the interval between the bit lines 8 in the present embodiment is about half of the interval between the existing bit lines 8, so that the planar size R of the memory cell in the present embodiment is less than the planar size R1 of the existing memory cell. Specifically, it may be learned that the planar size R1 of the existing memory cell is about 160×100 nm2, and the planar size R of the memory cell of the present embodiment is less than that of the existing memory cell.

In the embodiment, for example, the lower conductive layer (source) 3 including n-type polysilicon is formed on the substrate 1 via the insulating layer 2, which is not limited thereto. The lower conductive layer (source) may also be a highly doped n-type well region formed in a P-type silicon substrate, for example.

The NAND flash memory includes a plurality of blocks, each of the blocks including a three-dimensional NAND string as described above. The memory cell may be a single level cell (SLC) type with a one-bit (binary data) memory or with a multi-bit memory. In the NAND flash memory, readout or programming is performed in units of pages, and erased in units of blocks. Since these operations are well known, the descriptions thereof are omitted herein.

The preferred embodiments of the invention are described in detail, but the invention is not limited to the specific embodiments. Various modifications and variations can be made within the scope of the spirit of the invention in the claims.

What is claimed is:

1. A three-dimensional NAND flash memory, comprising:
a substrate;
a lower conductive layer formed in or on the substrate;
a plurality of stacks extending along a first direction on the lower conductive layer and respectively comprising stacks of insulators and conductors stacked along a vertical direction from the substrate;
a plurality of channel stacks separately arranged along one side of the plurality of stacks and respectively comprising an insulating layer comprising a charge storage layer and a channel film, the insulating layer and the channel film extending along a vertical direction from the substrate, and a lower end of the channel film being electrically connected to the lower conductive layer, wherein a topmost surface of each stack comprises first portions covered by respective upper ends of the channel stacks and second portions exposed by the respective upper ends of the channel stacks; and
a plurality of upper conductive layers extending along a second direction orthogonal to the first direction, respectively arranged on the plurality of channel stacks, and electrically connected to an upper end of the channel film being crossed by the upper conductive layer.

2. The flash memory according to claim 1, wherein the plurality of channel stacks are arranged at a first interval along the first direction, and one NAND string comprises one of the channel stacks.

3. The flash memory according to claim 2, wherein the plurality of stacks are arranged at a second interval along the second direction, and a planar size of one memory cell is defined by the first interval and the second interval.

4. The flash memory according to claim 1, wherein one of the stacks comprises the one side and another side opposite to the one side, and the channel stack and the insulator are arranged between one side of a first stack and another side of a second stack adjacent to each other in the second direction.

5. The flash memory according to claim 1, wherein the upper conductive layer is a bit line, the lower conductive layer is a source line, an uppermost conductor of the stack is a gate of a selection transistor on a bit line side, and a lowermost conductor is a gate of a selection transistor on a source line side.

6. The flash memory according to claim 2, wherein the upper conductive layer is a bit line, the lower conductive layer is a source line, an uppermost conductor of the stack is a gate of a selection transistor on a bit line side, and a lowermost conductor is a gate of a selection transistor on a source line side.

7. The flash memory according to claim 3, wherein the upper conductive layer is a bit line, the lower conductive layer is a source line, an uppermost conductor of the stack is a gate of a selection transistor on a bit line side, and a lowermost conductor is a gate of a selection transistor on a source line side.

8. The flash memory according to claim 4, wherein the upper conductive layer is a bit line, the lower conductive layer is a source line, an uppermost conductor of the stack is a gate of a selection transistor on a bit line side, and a lowermost conductor is a gate of a selection transistor on a source line side.

9. The flash memory according to claim 5, wherein a conductor between the uppermost conductor and the lowermost conductor of the stack is a gate of a transistor of a memory cell and is connected to a corresponding word line.

10. A manufacturing method of a flash memory, applicable to a three-dimensional NAND flash memory, comprising:
a step of forming a lower conductive layer in or on a substrate;
a step of forming a stack by alternately stacking insulators and conductors on the lower conductive layer;
a step of etching the stack at a depth reaching the lower conductive layer to form a plurality of stacks extending along a first direction;
a step of forming channel stacks on an entire surface of the substrate comprising the plurality of stacks;
a step of etching the channel stacks to separately arrange the channel stacks along one side of each of the plurality of stacks, wherein a topmost surface of each stack comprises first portions covered by respective upper ends of the channel stacks and second portions exposed by the respective upper ends of the channel stacks;
a step of forming a plurality of upper conductive layers extending along a second direction orthogonal to the first direction on the channel stacks; and
a step of electrically connecting the plurality of upper conductive layers to an upper end of the channel stack being crossed by the upper conductive layer, respectively.

11. The manufacturing method of the flash memory according to claim 10, wherein
the step of forming the channel stacks comprises: a step of forming a first insulating layer; a step of forming a charge storage layer on the first insulating layer; a step of forming a second insulating layer on the charge storage layer; and a step of forming a channel film on the second insulating layer.

12. The manufacturing method of the flash memory according to claim 10, wherein
the step of electrically connecting comprises a step of forming a contact hole on an insulating film formed on the channel stacks, and the upper conductive layers is electrically connected to the upper end of the channel stack via the contact hole.

13. The manufacturing method of the flash memory according to claim 10, further comprising:
a step of forming an insulating film to cover the plurality of channel stacks and the plurality of stacks after the step of etching the channel stacks; and a step of planarizing the insulating film to expose the channel stacks.

14. The manufacturing method of the flash memory according to claim 10, wherein
a film thickness of the lower conductive layer is sufficiently large as compared to a step or a recess formed on a surface of the lower conductive layer during etching of the stacks.

15. The manufacturing method of the flash memory according to claim 10, wherein
a film thickness of the lower conductive layer is sufficiently large as compared to a step or a recess formed on a surface of the lower conductive layer during etching of the channel stacks.

\* \* \* \* \*